United States Patent [19]

Dubuisson et al.

[11] Patent Number: 4,859,520

[45] Date of Patent: Aug. 22, 1989

[54] MONOLITHIC SUBSTRATE FOR AN ELECTRONIC POWER COMPONENT AND PROCESS FOR THE PRODUCTION THEREOF

[75] Inventors: Jacques Dubuisson, Paris; Rene Boutterin, Montlhery, both of France

[73] Assignee: Interconnexions Ceramiques, Courbevoie, France

[21] Appl. No.: 169,125

[22] Filed: Mar. 9, 1988

Related U.S. Application Data

[63] Continuation of Ser. No. 52,207, May 19, 1987, abandoned, which is a continuation of Ser. No. 833,033, Feb. 26, 1986, abandoned.

[30] Foreign Application Priority Data

Feb. 26, 1985 [FR] France .................................. 85-02749

[51] Int. Cl.⁴ ........................... B32B 3/24; H05K 7/20
[52] U.S. Cl. .................................. 428/137; 428/166; 428/188; 428/901; 174/68.5; 361/382; 361/385
[58] Field of Search ............... 361/385, 382, 383, 381, 361/414; 174/68.5; 428/166, 188, 137, 138, 901

[56] References Cited

U.S. PATENT DOCUMENTS 3,361,195 1/1968 Meyerhoff et al. .............. 361/385 X Primary Examiner—Alexander S. Thomas
Attorney, Agent, or Firm—Oblon, Fisher, Spivak, McClelland & Maier

[57] ABSTRACT

The invention concerns a monolithic substrate for an electronic power component which is formed by a sintered stack of layers of dielectric material having an internal system of ducts for the circulation of a cooling fluid. The system is a closed system which opens at the surface of the substrate by way of two orifices which respectively provide for the intake of the pressurized fluid into the internal system of ducts and the removal thereof from said system.

7 Claims, 2 Drawing Sheets

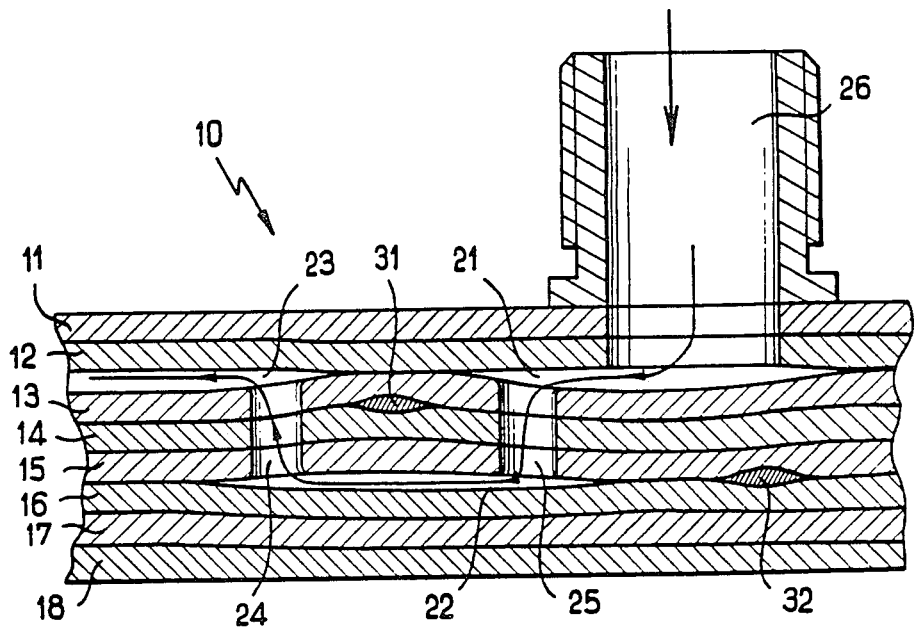
FIG_1
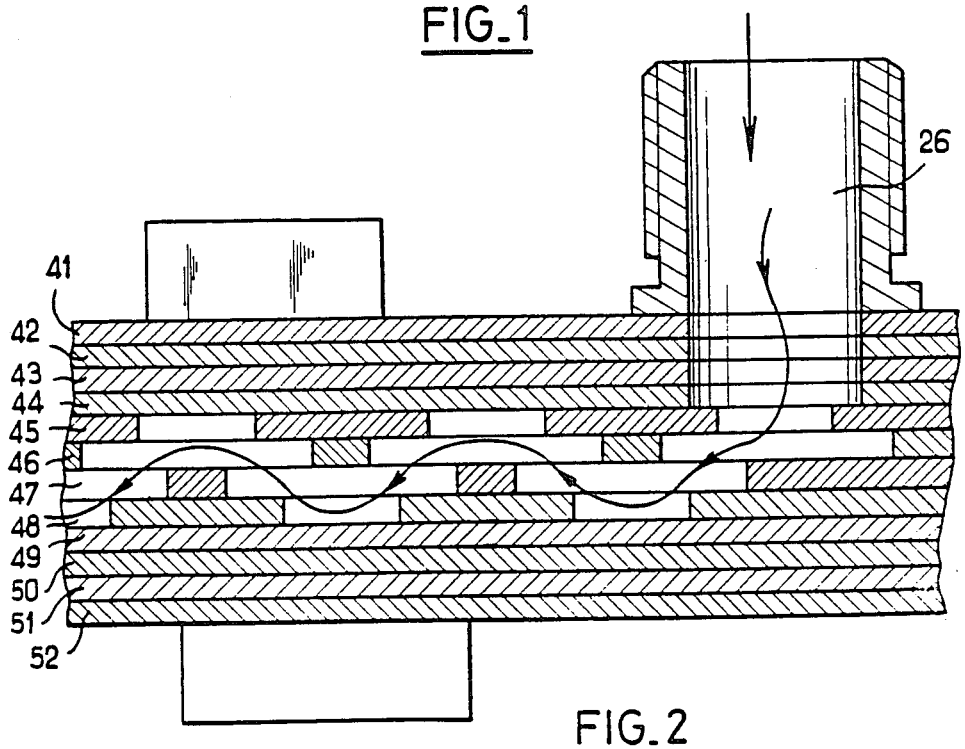
FIG_2

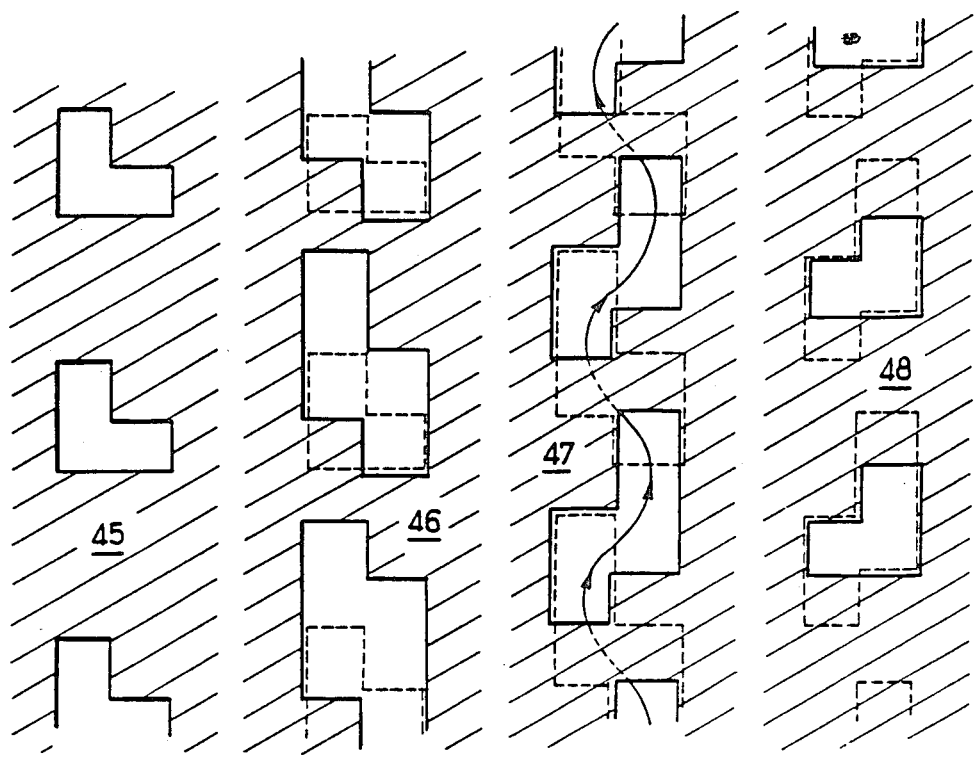
FIG_3a  FIG_3b  FIG_3c  FIG_3d

MONOLITHIC SUBSTRATE FOR AN ELECTRONIC POWER COMPONENT AND PROCESS FOR THE PRODUCTION THEREOF

This application is a continuation of application Ser. No. 052.207 filed on May 19, 1987 now abandoned which application is a continuation of application Ser. No. 833,033 filed on Feb. 26, 1986 now abandoned.

BACKGROUND OF THE INVENTION

The present invention concerns monolithic substrates for electronic power components. Such substrates are formed by a sintered stack of layers of dielectric material, generally a ceramic, or an alumina for hyperfrequency applications.

Such substrates can be used both for carrying semiconductor devices at a high density (they are then known as a chip carrier), or as substrates which are intended for producing hybrid circuits, using a procedure which is conventional in itself. In both cases, the substrates are often interconnection substrates, that is to say they include integrated conducting connections (which are buried in the substrate or formed at the surface thereof) which will subsequently be connected to terminals of the component. Such interconnections are often distributed over a plurality of layers, wherein interconnections from one layer to another and to the surface of the substrate are incorporated in accordance with a predetermined layout.

By virtue of the high density of the components, or when there is a wish to use power components (amplifiers in a hybrid circuit for example), it becomes necessary to absorb and dissipate a substantial amount of heat which is given off by the components. By way of example, it is often necessary to dissipate an amount of power of the order of 35 watts by means of a substrate of standardized dimensions of 152.4×86.36 mm.

For that purpose, the material generally chosen for the substrate is a material which is a good conductor of heat such as alumina which also has excellent dielectric and mechanical properties. That choice is important in particular when very strong currents pass through the buried interconnections, in order to drain the heat produced in the center of the substrate towards the surface thereof.

In order to dissipate the heat which is drained away in this manner, a first method contemplates using metallic radiators which are glued to the back of the substrate, the heat being discharged by conduction through the mass of the radiator and then by natural or forced convection to the ambient atmosphere.

Another procedure which can be used in combination with that described above comprises providing, in the center of the substrate, metallization portions which act as heat sinks and which open onto a face of the substrate by way of studs which are then welded to a metal chassis made, for example, of copper or Duralumin.

However those two methods suffer from the disadvantages that they occupy a complete face of the substrate which is therefore no longer available for carrying components, they necessitate substantial metal masses in order to remove the heat produced by conduction and convection, and finally, for that eason, they limit the options in regard to physical arrangements of the substrate and the components within the piece of equipment.

At any event, the possibility of in situ absorption of the heat produced is limited by virtue of the interposition of an intermediate member, a heat sink or a radiator.

SUMMARY OF THE INVENTION

The present invention proposes a novel substrate structure which permits those disadvantages to be overcome.

For that purpose, the substrate of the present invention includes an internal system of ducts for the circulation of a cooling fluid. The duct sytem is a closed system which opens at the surface of the substrate by way of two orifices, one of which provides for the intake of the pressurized fluid into the internal duct system and the other for the removal thereof from said system.

Preferably, the system is formed by duct segments each limited to selected layers. The entire system of duct segments are distributed over a plurality of levels with respect to the thickness of the stack, each of which consists of one o more layers and has a duct segments extending therethrough. The segments are interconnected from one level to the next.

Preferably, the interconnection between the duct segments is formed by wells formed by the removal of material in the layers through which the fluid is to pass.

Alternatively, or in addition, the interconnection between the duct segments may also be produced by mutually facing regions of the duct segments which belong to two adjacent layers.

In a first embodiment, the duct segments are defined between two adjacent layers by a residual volume which is formed at the interface of said layers along a predetermined pattern.

In a second embodiment, the ducts are defined by the removal of material in certain layers of the stack, in accordance with a predetermined pattern.

The invention also concerns a process for the production of the substrate in accordance with the first embodiment referred to above, wherein the residual volume is produced by the deposit of an evanescent ink in accordance with the predetermined pattern on at least one of the sheets of raw dielectric material before stacking, said ink being an ink which has no mineral pigment and which is suitable for preventing cosintering of the two adjacent layers along said pattern during baking.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 1 is a sectional view of a substrate in accordance with the first embodiment of the invention;

FIG. 2 is the same view as that shown in FIG. 1, but of a second embodiment of the invention; and FIGS. 3a to 3d are plan views showing the layout of the openings which are punched into each of the layers of the substrate in FIG. 2 to form the fluid flow system of the embodiment.

DETAILED DESCRIPTION OF THE PREFERRED EMBODIMENTS

It will first be noted that, in the following description, the system of ducts for the circulation of the cooling fluid is integrated in the substrate, the electrical interconnection levels and the duct interconnection levels being in interleaved relationship. The invention however also applies to substrates in which the system of electrical interconnections and the system of ducts are two staged, noninterleaved systems: that is the case in particular when the final substrate is produced from two superposed substrates which are joined together to form a single monolithic element (by sintering, gluing etc.), one of the initial substrates being a conventional electrical interconnection substrate and the other initial substrate being a specific cooling substrate which is joined to the former.

On the other hand, the preferred material used for the substrates is alumina, by virtue of its excellent thermal properties (a very good conductor), dielectric properties (permitting use in relation to hyperfrequencies), and mechanical properties. A preferred composition is that which is described in detail in French patent application No. 83-19689, filed Dec. 8, 1983 and entitled "Alumina Interconnection Substrate for an Electronic component": that composition comprises from 92 to 98% of $Al_2O_3$ (preferably 96%), the balance comprising magnesium titanate whose formula is between ($TiO_2$, 0.5 MgO) and ($TiO_2$, 6 MgO), preferably ($TiO_2$, MgO), the conductor tracks being made of palladium or a silver-palladium alloy.

That composition has the advantage of retaining all the properties of ultra-pure alumina while reducing the maximum baking temperature to a value of the order of 1400°, which baking operation may be carried out in an oxidizing atmosphere.

If that composition is a preferred composition, it is nonetheless not limitative and other materials may be used such as ultra-pure alumina or ceramics of conventional types which are used for this type of substrate.

FIG. 1 shows a first embodiment in which the substrate 10 is formed by a sintered stack of layers 11, 12, . . . 18 of dielectric material. The internal system of ducts is formed by a series of duct segments 21, 22, 23 defined between wwo adjacent layers (for example the layers 12 and 13 or 15 and 16 respectively) by a residual volume formed at the interface of the layers, along aq predetermined pattern. The interconnections are formed by means of wells 24 and 25 formed by removing material from the layers through which the fluid is to pass. The drawing shows the orifice for the intake of pressurized fluid, at 26, which communicates with the internal duct system.

The orifice 26 is connected to a primary fluid system, generally a closed circuit which recycles the fluid taken from the internal system of the substrate by way of another orifice (not shown), by means of a heat exchanger and a pump, in accordance with a per se conventional technique. The cooling fluid may be water or preferably a suitable inert fluid such as FLUORINERT (registered trademark of 3M Corporation) or GALDEN (registered trademark of MONSANTO Corporation), which are fluorine-bearing liquids that are generally used for cooling radiators or chasses of electronic circuits.

The fluid used may also be a gaseous fluid; the choice of fluid is governed by the amount of heat which is given off and by the capacity of the heat exchanger for discharging the heat which is drawn off in situ.

The pump and the heat exchanger may be common to the whole of the equipment and may supply a plurality of substrates which are designed on the basis of the same principle. Such centralization which is not possible with the radiators of conventional types (which are necessarily individual) ensures a considerable savings with respect to volume and weight for items of equipment which combine a large number of circuits distributed over separate substrates.

The fluid circulation system may be optimized in dependence on the circuit that the substrate is intended to carry. Once the hot spots are located (for example by infra-red thermography), an effort may be made to reduce the thickness of alumina through which the heat has to pass between the hot spot and the closest duct providing for the primary heat exchange effect, that is to say, absorption of the heat in situ. In that way it is possible to design high-power circuits which can operate at elevated ambient temperatures: a maximum operating temperature of 80° to 85° C. and a maximum junction temperature of 110° to 120° C. limit the maximum temperature difference to about 30°. Levels of performance of that kind may be achieved in the range of power values and the format indicated hereinbefore, by virtue of the structure of the invention.

In order to produce the substrate shown in FIG. 1, the process comprises the following steps:

First, deposit on a certain number of layers an evanescent paste (that is to say a paste which will disappear completely in the baking operation, being therefore an ink without any mineral pigment), in accordance with a pattern corresponding to the different segments of ducts to be formed at a given level. The evanescent substance may be a conventional binder such as an unfilled polyvinylbutyral, provided that it is suited to the binder of the ceramic material, that is to say, it does not react therewith.

Second, in the same fashion, deposit of an ink charged with a mineral pigment to form the network of electrical interconnections (such interconnections are denoted by references 31 and 32 for example in FIG. 1).

Third, pierce holes forming interconnections from one layer to another and from a layer to the surface. This may involve either interconnecting the duct segments of the cooling system (the holes are not then metallized) or interconnecting the conductor tracks (the holes are then metallized in conventional fashion).

The layers are then stacked, compressed and sintered. The increased thickness formed at the location where the evanescent paste has been deposited will prevent sintering of the two adjacent layers at that location. In the baking operation, the paste will gradually disappear, leaving a residual volume at the interface between the two layer. It is these residual volumes which together will form the duct segments of the cooling system.

Using this method, it is possible to produce ducts whose maximum thickness is 20 $\mu$m) and whose width is of the order of from 1 to 1.5 mm. The total thickness of the substrate is of the order of from 1 to 1.5 mm and the use of the particular type of alumina referred to hereinbefore makes it possible for the fluid to be caused to circulate directly in contact with the alumina, the latter being virtually devoid of porosity (porosity always less than 1 $\mu$m).

FIG. 2 shows a second embodiment in which the duct segments are no longer defined at the interface of two adjacent layers but by the removal of material in certain layers of the stack, in accordance with a predetermined pattern. In FIG. 2, for example, the layers denoted by reference numerals 45 to 48 are perforated in the manner shown in FIGS. 3a to 3d respectively. FIGS. 3b to 3d show in broken lines the pattern of the immediately lower layer so as to more clearly to show the regions through which the fluid may pass from the level of one layer to the next.

If attention is directed to FIG. 3c, it will be noted that two adjacent layers provided with suitable patterns are sufficient to provide for circulation of the fluid. It is preferred however to add additional layers in order to facilitate circulation of the fluid at the locations at which there could be a pressure drop.

The thickness of each of the layers which are perforated may vary between 50 and 250 μm. If it is provided that there is always a surface that is common to at least two layers, the flow thickness may thus be of from 0.1 to 0.5 mm, for a width of the order of 1 mm to 2 mm.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. The monolithic substrate in an electronic power component, comprising:
    a sintered stack of layers of dielectric material having a network of integrated electrically conducting connections between said layers;
    a closed system of cooling fluid ducts within said stack;
    an inlet orifice extending between said duct system and an exterior surface of said stack; and
    an outlet orifice extending between said duct system and an exterior surface of said stack.

2. The monolithic substrate of claim 1 wherein said duct system comprises:
    a plurality of duct segments each extending through a predetermined level with respect to the thickness of said stack; and
    interconnection means connecting said duct segments.

3. The monolithic substrate of claim 2 wherein said ducts comprise wells formed by the removal of material in layers through which the fluid is to pass.

4. The monolithic substrate of claim 2 wherein said interconnection means comprise mutually facing regions of said duct segments for two adjacent layers.

5. The monolithic substrate according to claim 1 wherein said ducts are defined between two adjacent layers by a residual volume formed at the interface of said adjacent layers along a predetermined pattern.

6. The monolithic according to claim 1 wherein said ducts are defined by removed material in certain layers of the stack, in accordance with a predetermined pattern.

7. The monolithic substrate of claim 1 wherein said network of integrated electrically conducting connection and said duct system are interleaved.

* * * * *